(12) United States Patent
Lee et al.

(10) Patent No.: US 7,868,538 B2
(45) Date of Patent: Jan. 11, 2011

(54) ORGANIC LIGHT EMITTING DISPLAY DEVICE AND METHOD OF FABRICATING THE SAME

(75) Inventors: Sang-Bong Lee, Suwon-si (KR); Sok-Won Noh, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 250 days.

(21) Appl. No.: 11/953,187

(22) Filed: Dec. 10, 2007

(65) Prior Publication Data

US 2008/0143249 A1 Jun. 19, 2008

(30) Foreign Application Priority Data

Dec. 15, 2006 (KR) ...................... 10-2006-0128803

(51) Int. Cl.
*H05B 33/00* (2006.01)
(52) U.S. Cl. .................. 313/504; 313/506; 313/113
(58) Field of Classification Search ....................... None
See application file for complete search history.

(56) References Cited

U.S. PATENT DOCUMENTS

| 6,366,017 | B1 * | 4/2002 | Antoniadis et al. | .......... 313/506 |
|---|---|---|---|---|
| 7,161,291 | B2 * | 1/2007 | Mori et al. | ................... 313/503 |
| 7,196,469 | B2 * | 3/2007 | Shore et al. | .................. 313/506 |
| 2006/0192471 | A1 * | 8/2006 | Inoue et al. | ................... 313/113 |
| 2006/0279190 | A1 * | 12/2006 | Nakayama | ................... 313/113 |
| 2007/0001570 | A1 * | 1/2007 | Nomura et al. | ............. 313/113 |
| 2009/0200938 | A2 * | 8/2009 | Zhu et al. | ................... 313/506 |

FOREIGN PATENT DOCUMENTS

| JP | 2005-510034 | 4/2005 |
|---|---|---|
| JP | 2005-340187 | 12/2005 |
| JP | 2006-73484 | 3/2006 |
| KR | 2003-77476 | 10/2003 |
| KR | 2005-46624 | 5/2005 |
| KR | 2006-46141 | 5/2005 |
| KR | 2005-68234 | 7/2005 |

* cited by examiner

*Primary Examiner*—Ashok Patel
(74) *Attorney, Agent, or Firm*—Stein McEwen, LLP

(57) ABSTRACT

An organic light emitting display device (OLED), which does not include a separate cathode, and a method of fabricating the same, are provided. The OLED includes: a substrate; a reflective layer disposed on the substrate; a charge generation layer disposed on the reflective layer; an organic layer disposed on the charge generation layer and including an emission layer; and an anode disposed on the organic layer.

22 Claims, 6 Drawing Sheets

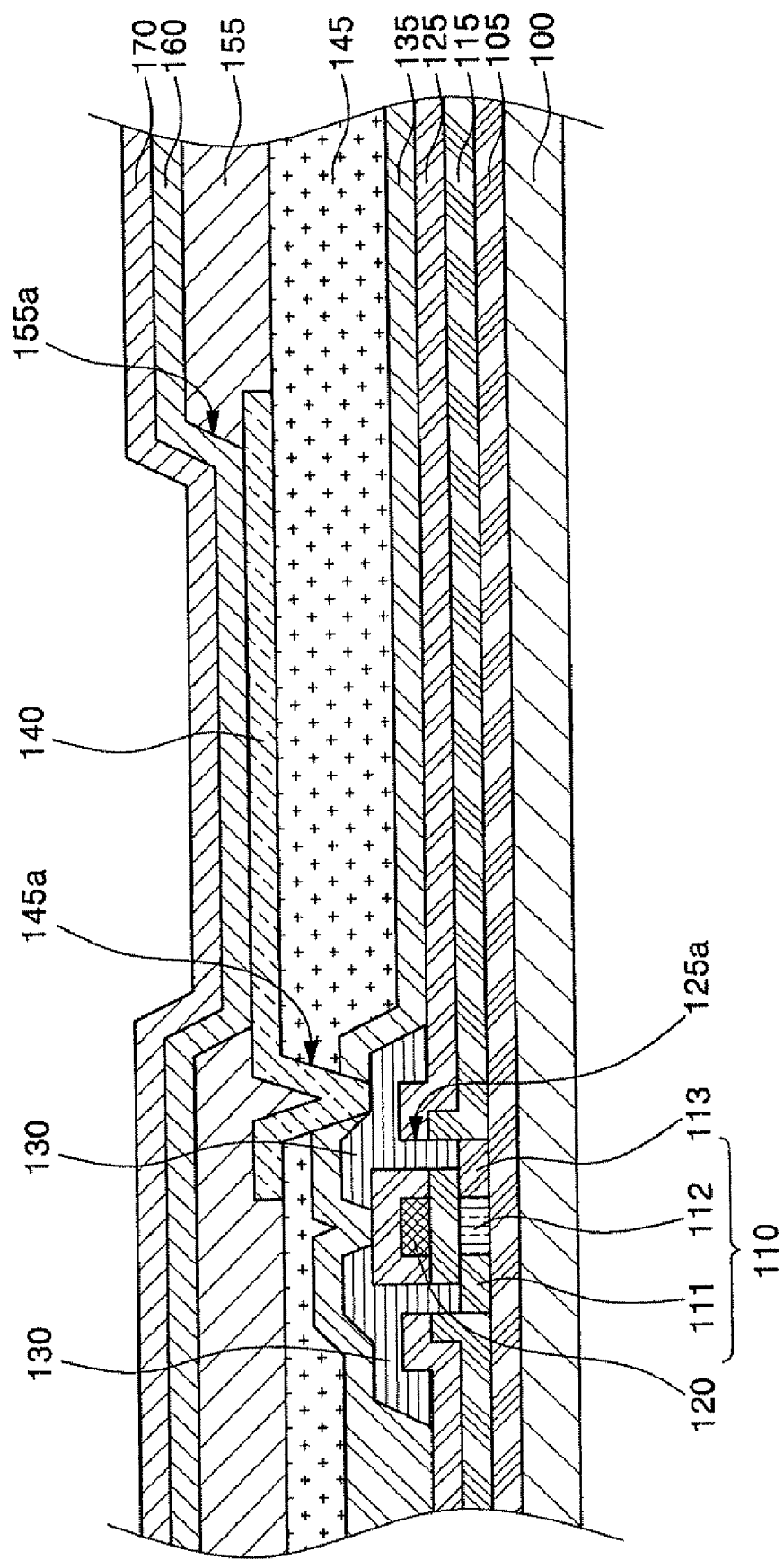

ORGANIC LIGHT EMITTING DISPLAY DEVICE AND METHOD OF FABRICATING THE SAME

CROSS-REFERENCE TO RELATED APPLICATION

This application claims the benefit of Korean Application No. 2006-128803, filed Dec. 15, 2006, in the Korean Intellectual Property Office, the disclosure of which is incorporated herein by reference.

BACKGROUND OF THE INVENTION

1. Field of the Invention

Aspects of the present invention relate to an organic light emitting display device (OLED) and a method of fabricating the same, and more particularly, to an OLED in which a cathode is replaced with a charge generation layer, and a method of fabricating the same.

2. Description of the Related Art

An OLED is a display device that uses a phenomenon in which an electron and a hole are injected into an organic layer through a cathode and an anode, and are recombined to generate an exciton, to thereby emit light with a specific wavelength. The OLED has advantages of a wide viewing angle, high brightness, and improved implementation of motion pictures due to a response time that is 30,000 times faster than recently commercialized liquid crystal display device (LCD). The OLED has a stacked structure capable of increasing an emission efficiency of light by the recombination of electrons and holes.

FIG. 1 is a cross-sectional view of a typical inverted type OLED. Referring to FIG. 1, a buffer layer 105 is formed on a substrate 100, and an amorphous silicon layer (not shown) is formed on the buffer layer 105, which is then crystallized into a polycrystalline silicon layer (not shown).

The polycrystalline silicon layer is patterned to form a semiconductor layer 110, and a gate insulating layer 115 is formed on an entire surface of the substrate 100 having the semiconductor layer 110. A gate electrode 120 is formed in a region of the gate insulating layer 115, which corresponds to the semiconductor layer 110. A photoresist pattern (not shown) is disposed on the gate electrode 120 as a mask, and then a source region 111, a drain region 113, and a channel region 112 are formed in the semiconductor layer 110 by performing an ion doping process.

An interlayer insulating layer 125 is formed on the entire surface of the substrate 100 having the gate electrode 120. Afterwards, the gate electrode 120 and the interlayer insulating layer 125 are etched, to thereby form a contact hole 125a to expose the source region 111 and the drain region 113. Source and drain electrodes 130 are respectively formed through the contact hole 125a so as to be connected with the source region 111 and the drain region 113.

A passivation layer 135 is formed on the entire surface of the substrate 100 having the source and drain electrodes 130, and a planarization layer 145 is formed on the passivation layer 135. The passivation layer 135 and the planarization layer 145 are etched to form a via hole 145a. A cathode 140 is formed on the planarization layer 145 and is connected to the source and drain electrodes 130 through the via hole 145a.

A pixel defining layer 155 is formed on the cathode 140, and then etched, to thereby form an opening 155a which exposes a part of the cathode 140. An organic layer 160 including an emission layer is formed on the entire surface of the substrate 100, and includes the opening 155a. An anode 170 is formed on the organic layer 160. Thus, the inverted type OLED is formed.

However, the typical inverted type OLED of FIG. 1 has a problem in which a cathode formed of an alkali metal or an alkali earth metal (having a low work function) is easily oxidized when an anode is formed of ITO or IZO (by sputtering). To overcome this problem, the cathode has to be formed of a material having the same work function as the anode and a strong oxidation resistance. However, it is very difficult to accomplish such requirements with current technology.

SUMMARY OF THE INVENTION

Aspects of the present invention provide an organic light emitting display device (OLED) having a charge generation layer in place of a cathode, and a method of fabricating the same.

In an aspect of the present invention, an OLED includes: a substrate; a reflective layer disposed on the substrate; a charge generation layer disposed on the reflective layer to generate electrons and holes; an organic layer disposed on the charge generation layer and including an emission layer; and an anode disposed on the organic layer.

In another aspect of the present invention, a method of fabricating an OLED includes: preparing a substrate; forming a reflective layer on the substrate; forming a charge generation layer on the reflective layer to generate electrons and holes; forming an organic layer including an emission layer on the charge generation layer; and forming an anode on the organic layer.

In yet another aspect of the present invention, an OLED includes: a substrate; a semiconductor layer disposed on the substrate; a gate insulating layer disposed on an entire surface of the substrate including the semiconductor layer; a gate electrode disposed in a region corresponding to the semiconductor layer on the gate insulating layer; an interlayer insulating layer disposed on the entire surface of the substrate including the gate electrode; source and drain electrodes disposed on the interlayer insulating layer, and electrically connected to the semiconductor layer; a passivation layer disposed on the entire surface of the substrate including the source and drain electrodes; a planarization layer disposed on the passivation layer; a reflective layer disposed on the planarization layer; a charge generation layer disposed on the substrate including the reflective layer, and electrically connected to the source or drain electrode, and to generate electrons and holes; an organic layer disposed on the charge generation layer, and including an emission layer; and an anode disposed on the organic layer.

In yet another aspect of the present invention, a method of fabricating an OLED includes: preparing a substrate; forming a semiconductor layer on the substrate; forming a gate insulating layer on an entire surface of the substrate including the semiconductor layer; forming a gate electrode in a region corresponding to the semiconductor layer on the gate insulating layer; forming an interlayer insulating layer on the entire surface of the substrate including the gate electrode; forming source and drain electrodes electrically connected to the semiconductor layer on the interlayer insulating layer; forming a passivation layer on the entire surface of the substrate including the source and drain electrodes; forming a planarization layer on the passivation layer; forming a reflective layer on the planarization layer; forming a charge generation layer electrically connected to the source or drain electrode on the substrate including the reflective layer, and to generate electrons and holes; forming an organic layer including an organic emission layer on the charge generation layer; and forming an anode on the organic layer.

In yet another aspect of the present invention, an organic light emitting display device (OLED) includes: a substrate; a reflective layer disposed on the substrate and reflecting generated light; a charge generation layer disposed on the reflective layer to generate electrons and holes; an organic layer disposed on the charge generation layer and including an emission layer to generate and emit the light; and an anode disposed on the organic layer, wherein an electric field is applied to the charge generation layer to generate the electrons and holes and not to the reflective layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will be apparent and more readily appreciated from the following description of the aspects, taken in conjunction with the accompanying drawings of which:

FIG. 1 is a cross-sectional view of a typical inverted type organic light emitting display device (OLED);

DETAILED DESCRIPTION OF THE EMBODIMENTS

Figure 2A:
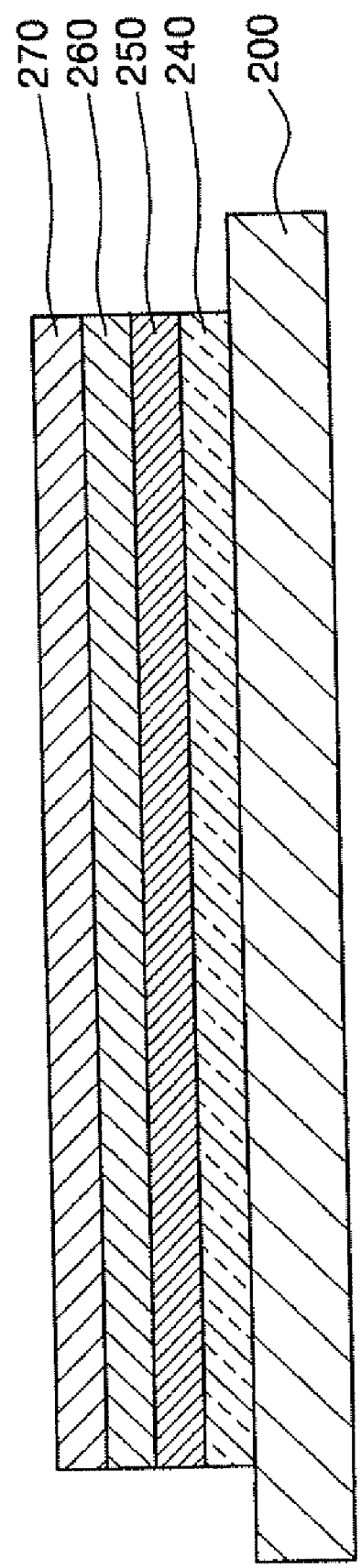
FIG. 2A is a schematic cross-sectional view of an OLED according to an aspect of the present invention.

Reference will now be made in detail to aspects of the present invention, examples of which are illustrated with reference to the accompanying drawings, wherein like reference numerals refer to like elements throughout. The aspects are described below in order to explain the present invention by referring to the figures.

Figure 2B:
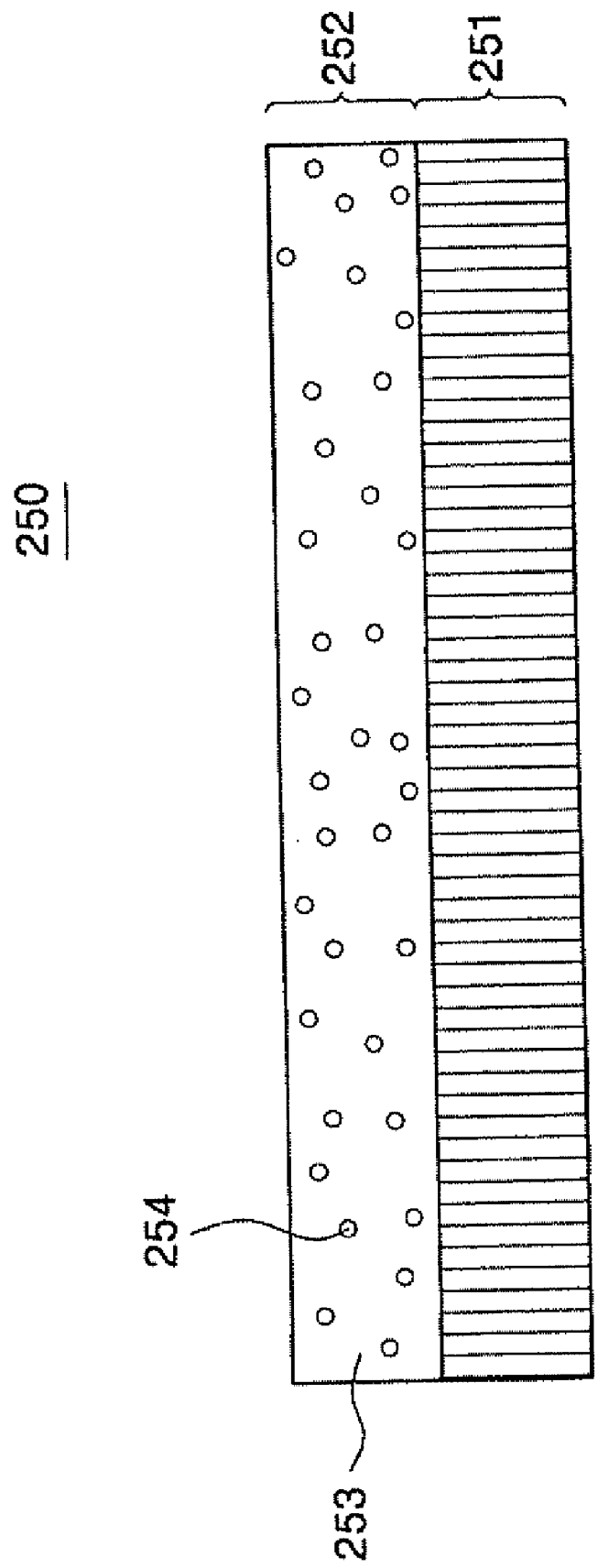
FIG. 2B is a detailed view of a charge generation layer according to an aspect of the present invention.

FIG. 2A is a cross-sectional view of an organic light emitting display device (OLED) according to an aspect of the present invention, and FIG. 2B is a detailed view of a charge generation layer of the OLED according to an aspect of the present invention. Referring to FIG. 2A, a reflective layer 240 is formed on a substrate 200. A charge generation layer 250 is formed on the reflective layer 240. An organic layer 260 including an emission layer is formed on the charge generation layer 250. An anode 270 is formed on the organic layer 260.

In FIG. 2A, the substrate 200 may be a glass substrate, a stainless steel substrate, or a plastic substrate, for example. The reflective layer 240 may be formed of aluminum, silver, or an alloy thereof, and has an excellent reflection characteristic. In FIG. 2B, the charge generation layer 250 has a structure in which an inorganic compound layer 251 (such as an inorganic metal oxide layer) and a mixed layer 252 (including a material for an electron transport layer 253 and a metal dopant 254) are sequentially stacked. The charge generation layer 250 may be formed by a vacuum evaporation method.

With reference to FIGS. 2A and 2B, when an electric field is applied to the charge generation layer 250, electrons are generated from the mixed layer 252 of the charge generation layer 250. The electrons then tend to travel to the anode 270. Also, holes are generated from the inorganic compound layer 251, and then tend to travel in an opposite direction from the anode 270. Moreover, the charge generation layer 250 prevents or reduces damage to the reflective layer 240, which may occur during formation of the anode 270.

The charge generation layer 250 may be formed to a thickness of 70 to 2000 Å. When the thickness of the charge generation layer 250 is less than 70 Å, the charge generation layer 250 cannot sufficiently generate the electrons and holes, and also cannot improve a hole injection efficiency and an electron injection efficiency. However, when the thickness of the charge generation layer 250 is more than 2000 Å, reliability of the OLED device decreases due to occurrence of a cross talk phenomenon caused by the inorganic compound layer 251, and thereby cause manufacturing time and cost to increase.

The inorganic compound layer 251 is formed to a thickness of 20 to 1000 Å. When the thickness of the inorganic compound layer 251 is less than 20 Å, the inorganic compound layer 251 may not sufficiently generate the holes, and also may not improve the hole injection efficiency. Conversely, when the thickness of the inorganic compound layer 251 is more than 1000 Å, the reliability of the OLED device decreases due to occurrence of the cross talk phenomenon, and thereby cause the manufacturing time and cost to increase.

The inorganic compound layer 251 includes one selected from a group consisting of tungsten oxide ($WO_3$), vanadium oxide ($V_2O_5$), molybdenum oxide ($MoO_x$), beryllium oxide ($Be_2O_3$), rhenium oxide ($Re_2O_7$), ferric chloride ($FeCl_3$), ferric bromide ($FeBr_3$), ferric iodide ($FeI_3$), aluminum chloride ($AlCl_3$), aluminum bromide ($AlBr_3$), gallium chloride ($GaCl_3$), gallium bromide ($GaBr_3$), gallium iodide ($GaI_3$), indium chloride ($InCl_3$), indium bromide ($InBr_3$), indium iodide ($InI_3$), antimony pentachloride ($SbCl_5$), arsenic pentafluoride ($AsF_5$), arsenic trifluoride ($AsF_3$), and boron trifluoride ($BF_3$).

The mixed layer 252 is formed of a mixture of a material for an electron transport layer 253 and a metal dopant 254 in a 1:1 ratio, and has a thickness of 20 to 1000 Å. When the thickness of the mixed layer 252 is less than 20 Å, the electrons cannot be sufficiently generated, and the electron injection efficiency cannot be improved. However, when the thickness of the mixed layer is more than 1000 Å, the manufacturing time and cost may increase.

Components for the electron transport layer 253 includes: a metal complex with a quinoline-based structure, such as Almq3 (Alq3, tris(4-methyl-8-quinolinolate)aluminum) and BeBbq2 bis(10-hydroxybenzo[h]-quinolinate beryllium) or a benzoquinoline-based structure; a mixed ligand complex such as BAlq (bis(2-methyl-8-quinolinolate)-(4-hydroxy-biphenyl)-aluminum); or a metal complex with an oxazole or thiazole ligand such as Zn(BOX)2 (bis[2-(2-hydroxyphenyl)-benzooxazolate]zinc and Zn(BTZ)2 (bis[2-(2-hydroxyphenyl)-benzothiazolate]zinc). Also, in addition to the metal complex, the components for the electron transport layer 253 may include: an oxadiazole derivative such as PBD (2-(4-biphenyl)-5-(4-tert-butylphenyl)-1,3,4-oxadiazole) and OXD-7 (1,3-bis[5-(p-tert-butylphenyl)-1,3,4-oxadiazole-2-yl]benzene); a triazole derivative such as TAZ (3-(4-tert-butylphenyl)-4-phenyl-5-(4-biphenyl)-1,2,4-triazole) and p-Et-TAZ (3-(4-tert-butylphenyl)-4-(4-ethylphenyl)-5-(4-biphenyl)-1,2,4-triazole); or a phenanthroline derivative such as BPhen (bathophenanthroline) and BCP (bathocuproin). The metal dopant 254 includes one selected from a group consisting of magnesium, cesium, and lithium.

The organic layer 260 may include at least one layer selected from a group consisting of a hole injection layer, a hole transport layer, a hole blocking layer, an electron transport layer, and an electron injection layer. The hole injection layer serves to facilitate injection of holes into the emission layer of the OLED, and increases the life span of the OLED. The hole injection layer may be formed of an aryl amine-based compound and starburst amines. More specifically, the hole injection layer may be formed of 4,4',4''-tris(3-methylphenylamino)triphenylamine (m-MTDATA), 1,3,5-tris[4-(3-methylphenylamino)phenyl]benzene (m-MTDATB), copper phthalocyanine (CuP), or other compounds. Also, the hole injection layer may be formed of an inorganic material, such as vanadium oxide or tungsten oxide that can be thermally deposited.

The hole transport layer may be formed of an arylene diamine derivative, a starburst compound, a biphenyl diamine derivative with a spiro radical, a trapezoidal compound, or other compounds. More specifically, the hole transport layer may be formed of N,N'-diphenyl-N,N'-bis(4-methylphenyl)-1,1'-biphenyl-4,4'-diamine (TPD) or 4,4'-bis[N-(1-naphthyl)-N-phenyl amino]biphenyl (NPB).

The emission layer may include red (R), green (G), and blue (B) light emitting materials. The red light emitting material may include a low molecular weight material such as Alq3(host)/DCJTB(fluorescent dopant), Alq3(host)/DCM (fluorescent dopant) and CBP(host)/PtOEP(phosphorescent organic metal complex); and a polymer such as a PFO-based polymer and a PPV-based polymer. The green light emitting material may include a low molecular weight material such as Alq3, Alq3(host)/C545t(dopant), CBP(host)/IrPPY(phosphorescent organic material complex); and a polymer such as a PFO-based polymer and a PPV-based polymer. In addition, the blue light emitting material may include a low molecular weight material such as DPVBi, spiro-DPVBi, spiro-6P, distyrylbenzene (DSB), distyrylarylene (DSA); and a polymer such as a PFO-based polymer and a PPV-based polymer.

When hole mobility is higher than electron mobility in the emission layer, the hole blocking layer prevents the holes from moving into the electron injection layer. Here, the hole blocking layer may be formed of one selected from a group consisting of 2-biphenyl-4-yl-5-(4-t-butylphenyl)-1,3,4-oxydiazole (PBD), spiro-PBD and 3-(4'-t-butylphenyl)-4-phenyl-5-(4'-biphenyl)-1,2,4-triazole (TAZ).

The electron transport layer may be formed of a metal compound capable of easily receiving electrons, for example, aluminum tri(8-hydroquinoline) (Alq3), which is excellent in stably transporting the electrons provided from the charge generation layer 250. The electron injection layer may be formed of at least one selected from a group consisting of 1,3,4-oxydiazole derivatives, 1,2,4-triazole derivatives, and LiF.

The organic layer 260 may be formed by one of a laser induced thermal imaging method, an inkjet-printing method, and a vacuum evaporation method. The anode 270 may be a transparent conductive layer, which is formed of indium tin oxide (ITO), indium zinc oxide (IZO), or indium tin zinc oxide (ITZO). The anode 270 may be formed by sputtering. Accordingly, the OLED according to an aspect of the present invention is formed as discussed in relation to FIGS. 2A and 2B.

Figure 3:
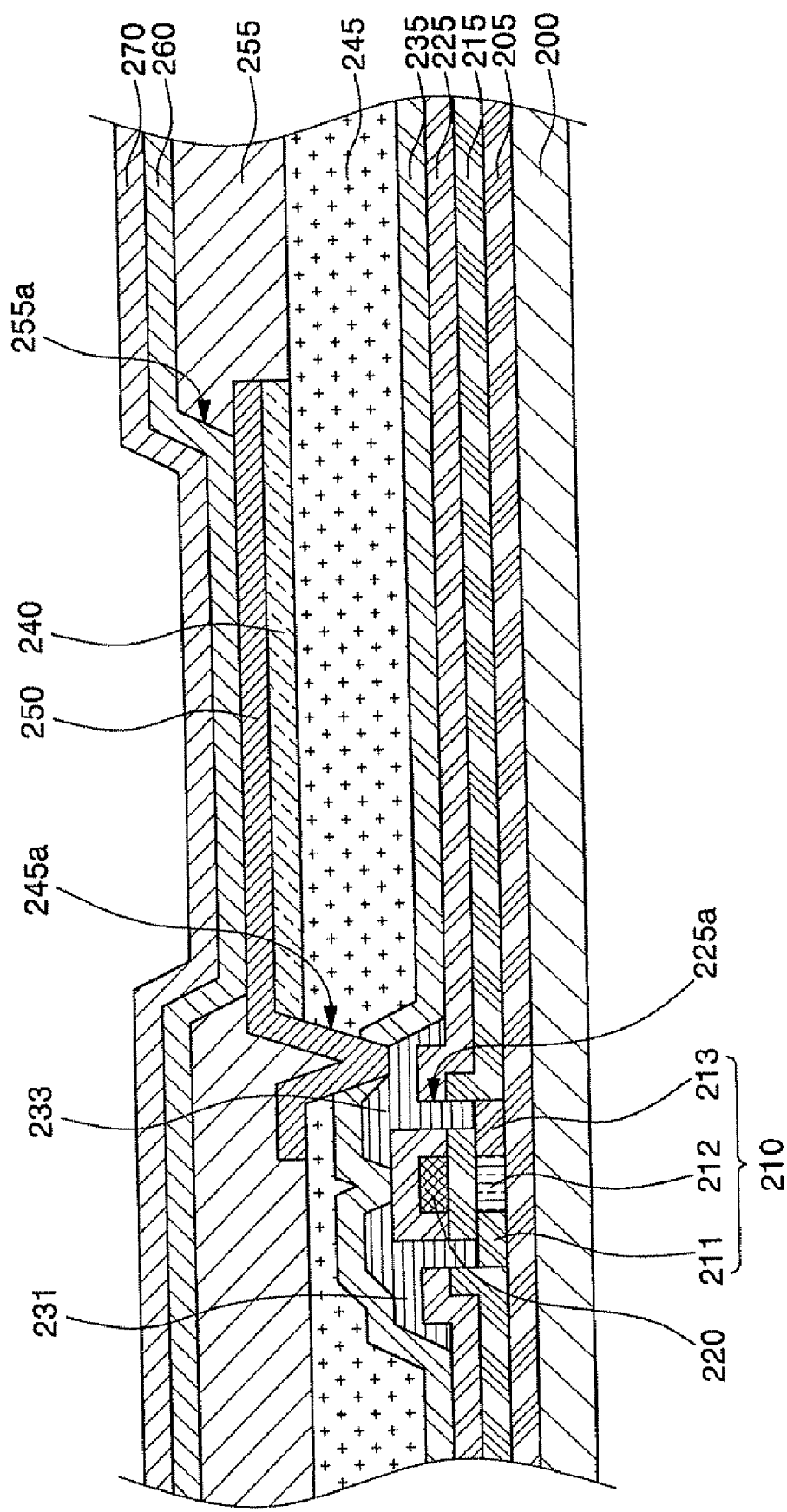
FIG. 3 is a cross-sectional view of an OLED according to another aspect of the present invention.

FIG. 3 is a cross-sectional view of an OLED according to another aspect of the present invention. Referring to FIG. 3, a buffer layer 205 is formed on a substrate 200. The substrate 200 is formed of glass, stainless steel, or plastic. The buffer layer 205 may be a silicon nitride layer, a silicon oxide layer, or a multiple layer thereof. Here, the buffer layer 205 prevents or reduces diffusion of moisture or impurities generated from the underlying substrate 200, or facilitates crystallization of a semiconductor layer 210 to be formed in a subsequent process by controlling a heat transfer rate during the crystallization process.

An amorphous silicon layer (not shown) that is formed on the buffer layer 205 is crystallized into a polycrystalline or single crystal silicon layer (not shown), and patterned, to thereby form the semiconductor layer 210. The amorphous silicon layer may be formed by chemical vapor deposition (CVD) or physical vapor deposition (PVD). Also, during or after the formation of the amorphous silicon layer, the amorphous silicon layer may be dehydrogenated to lower its hydrogen concentration. The amorphous silicon layer may also be crystallized by at least one technique selected from a group consisting of a rapid thermal annealing (RTA) technique, a solid phase crystallization (SPC) technique, a metal induced crystallization (MIC) technique, a metal induced lateral crystallization (MILC) technique, a super grain silicon (SGS) technique, an excimer laser annealing (ELA) technique, and a sequential lateral solidification (SLS) technique.

A gate insulating layer 215 is formed on the entire surface of the substrate 200 having the semiconductor layer 210. The gate insulating layer 215 is a silicon oxide layer, a silicon nitride layer, or a multiple layer thereof. A gate electrode 220 is formed by first forming a gate electrode material on a portion of the gate insulating layer 215. The gate electrode material is formed of one selected from a group consisting of aluminum (Al), an aluminum alloy (Al-alloy), molybdenum (Mo), and a molybdenum alloy (Mo-alloy). The gate electrode material may also be formed of a molybdenum-tungsten (MoW) alloy.

The gate electrode material is patterned to form the gate electrode 220, and a photoresist pattern (not shown) is temporarily disposed on the gate electrode 220. Then, a source region 211, a drain region 213, and a channel region 212 are formed by an ion doping process using the photoresist pattern as a mask.

An interlayer insulating layer 225 is formed on the entire surface of the substrate 200 having the gate electrode 220. Here, the interlayer insulating layer 225 may be a silicon nitride layer, a silicon oxide layer, or a multiple layer thereof. A contact hole 225a exposing the source region 211 and/or the drain region 213 is formed by etching the interlayer insulating layer 225. Source and drain electrodes 231, 233 are formed to be connected to the source region 211 and the drain region 213 through the contact hole 225a, respectively. Here, the source and drain electrodes 231, 233 may be formed of one selected from a group consisting of Mo, W, MoW, tungsten silicide ($WSi_2$), molybdenum silicide ($MoSi_2$), and Al. Thus, a thin film transistor including the semiconductor layer 210, the gate electrode 220, and the source and drain electrodes 231, 233 is formed.

A passivation layer 235 is formed on the entire surface of the substrate 200 having the source and drain electrodes 231, 233, and a planarization layer 245 is formed on the passivation layer 235. The passivation layer 235 may be a silicon oxide layer or a silicon nitride layer. The planarization layer 245 may be an organic layer, which is formed of one selected from a group consisting of polyimide, benzocyclobutene series resin, and acrylate. Also, the planarization layer 245 may also be an inorganic layer formed of silicate-on-glass.

A via hole 245a exposing the source and/or drain electrodes 231, 233 is formed by etching the planarization layer 245. In other words, the via hole 245a may expose the source electrode 231, the drain electrode 233, or both. A reflective layer 240 is formed on a partial region of the planarization layer 245. The reflective layer 240 may be formed of Al, silver (Ag), or an alloy thereof, which has an excellent reflection characteristic. The reflective layer 240 is not directly in contact with the source and/or drain electrodes 231, 233, nor is it directly in contact with the source and/or drain regions 211, 213.

A charge generation layer 250, which is connected to the source and/or drain electrodes 231, 233 through the via hole 245a, is formed on the substrate 200 having the reflective layer 240. The charge generation layer 250 has a structure in which an inorganic compound layer 251, and a mixed layer 252 including an electron transport material 253 and a metal dopant 254 are sequentially stacked, and may be formed by evaporation.

When an electric field is applied to the charge generation layer 250, electrons are generated from the mixed layer 252 of the charge generation layer 250, and then the electrons tend to travel to the anode 270. In this case, holes are generated from the inorganic compound layer 251, and then the holes tend to travel in the opposite direction from the anode 270. That is, the holes travel to the source and/or drain electrodes 231, 233. Moreover, the charge generation layer 250 serves to prevent or reduce damage to the reflective layer 240, which may occur during the formation of the anode 270 in a subsequent process. The description of the charge generation layer 250 has already been made in relations to FIGS. 2A and 2B, so further explanations will not be repeated.

An organic layer 260 having an emission layer is formed on the charge generation layer 250. The organic layer 260 may include at least one layer selected from a hole injection layer, a hole transport layer, a hole blocking layer, an electron transport layer, and an electron injection layer. The organic layer 260 may be formed by one of a laser induced thermal imaging method, an inkjet-printing method, and a vacuum evaporation method.

The anode 270 is formed on the organic layer 260. The anode 270 may be a transparent conductive layer, which is formed of ITO, IZO, or ITZO. The anode 270 may be formed by sputtering. Accordingly, the OLED according to another aspect of the present invention is formed as discussed in relation to FIG. 3.

Although the aspects of the present invention will be described with reference to the following examples, the scope of the present invention is not limited thereto.

<An OLED According to an Aspect of the Present Invention>

A silicon nitride layer having a thickness of 3300 Å was formed as a buffer layer on a substrate. A semiconductor layer was formed on the buffer layer to a thickness of 400 Å. A silicon nitride layer having a thickness of 1200 Å was formed as a gate insulating layer on the semiconductor layer, and a MoW alloy having a thickness of 1500 Å was formed as a gate electrode on the gate insulating layer. A silicon nitride layer having a thickness of 1500 Å was formed as an interlayer insulating layer on the entire surface of the substrate having the gate electrode, and source and/or drain electrodes formed of aluminum having a thickness of 1000 Å were connected to the semiconductor layer. A silicon nitride layer having a thickness of 0.1 μm was formed as a passivation layer on the entire surface of the substrate having the source and drain electrodes, and a planarization layer of acrylate having a thickness of 1 μm was formed on the passivation layer. A reflective layer of Al having a thickness of 2000 Å was formed on the planarization layer. A charge generation layer was formed on the reflective layer by sequentially stacking $WO_3$ having a thickness of 150 Å, and a mixed layer (made of $Alq_3$ (available from eRay) and Mg mixed at a 1:1 ratio) having a thickness of 100 Å. An electron transport layer of eRay-$Alq_3$ having a thickness of 200 Å was formed on the charge generation layer. An emission layer including TMM004 (available from Merck) as a host, and 8% GD33 (available from UDC) as a dopant, was formed on the electron transport layer, and a hole transport layer of IDE320 (available from Idemitsu) having a thickness of 150 Å was formed on the emission layer. Also, a hole injection layer of IDE406 (available from Idemitsu) having a thickness of 750 Å was formed on the hole transport layer. An anode of ITO having a thickness of 0.1 μm was formed on the hole injection layer.

<Comparative OLED>

A silicon nitride layer having a thickness of 3300 Å was formed as a buffer layer on a substrate. A semiconductor layer having a thickness of 400 Å was formed on the buffer layer. A silicon nitride layer having a thickness of 1200 Å was formed as a gate insulating layer on the semiconductor layer, and a gate electrode of a MoW alloy having a thickness of 1500 Å was formed on the gate insulating layer. A silicon nitride layer having a thickness of 1500 Å was formed as an interlayer insulating layer on the entire surface of the substrate having the gate electrode, and source and drain electrodes of aluminum having a thickness of 1000 Å were connected to the semiconductor layer on the interlayer insulating layer. A passivation layer of a silicon nitride layer having a thickness of 0.1 μm was formed on the entire surface of the substrate having the source and drain electrodes, and a planarization layer of acrylate having a thickness of 1 μm was formed on the passivation layer. A cathode connected to the source and drain electrodes of an alloy of Mg and Ag mixed in a 15:1 ratio and having a thickness of 1500 Å was formed on the planarization layer. An electron transport layer of $Alq_3$ (available from eRay) having a thickness of 200 Å was formed on the cathode. An emission layer including TMM004 (available from Merck) as a host, and 8% GD33 (available from UDC) as a dopant was formed on the electron transport layer, and a hole transport layer of IDE320 (available from Idemitsu) having a thickness of 150 Å was formed on the emission layer. Also, a hole injection layer of IDE406 (available from Idemitsu) having a thickness of 750 Å was formed on the hole transport layer. An anode of ITO having a thickness of 0.1 μm was formed on the hole injection layer.

Figure 4:
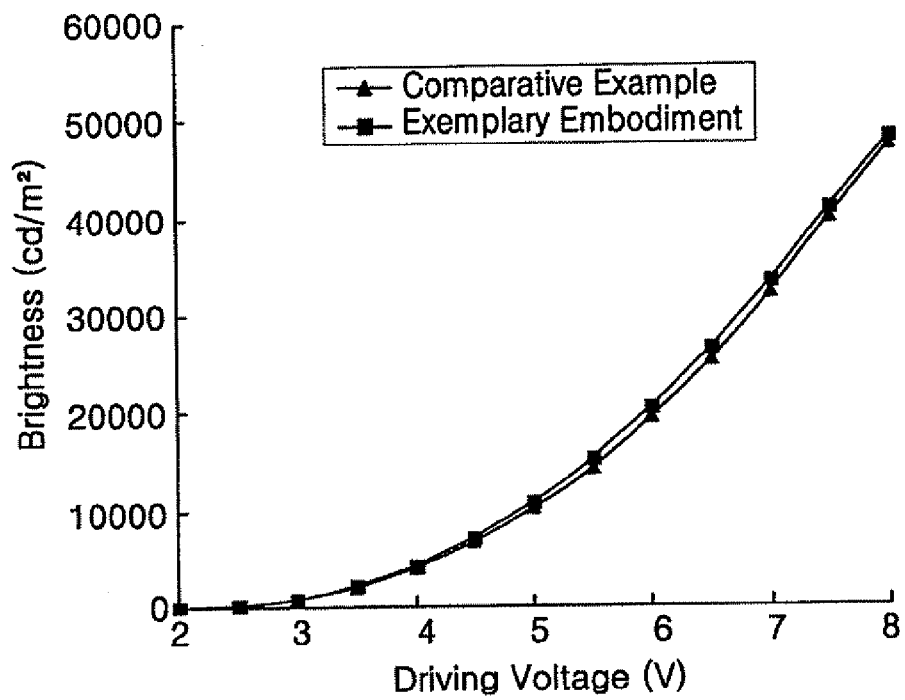
FIG. 4 is a graph illustrating a relationship between driving voltages and brightnesses in an OLED according to an aspect of the present invention and Comparative OLED.

FIG. 4 is a graph illustrating a relationship between driving voltages and brightnesses in an OLED according to an aspect of the present invention and a Comparative OLED. A horizontal axis represents the driving voltages (V), and a vertical axis represents the brightnesses (cd/m$^2$). Referring to FIG. 4, in the OLED according to an aspect of the present invention, when the driving voltages are 5V, 6V, and 7V, the brightnesses are about 10000 cd/m$^2$, 20000 cd/m$^2$, and 33000 cd/m$^2$, respectively. Also, in the Comparative OLED, when the driving voltages are 5V, 6V, and 7V, the brightnesses are about 10000 cd/m$^2$, 20000 cd/m$^2$, and 33000 cd/m$^2$, respectively. Accordingly, it can be noted that the OLED according to an aspect of the present invention shows similar brightnesses to those of the Comparative OLED when the OLED according to an aspect of the present invention has the same driving voltages as the Comparative OLED, even without a separate cathode.

Figure 5:
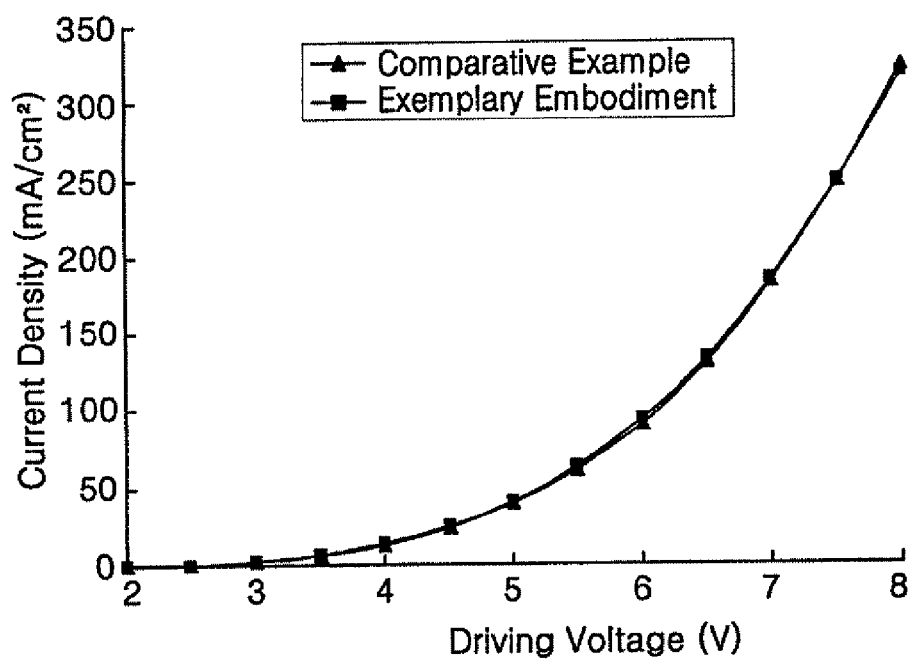
FIG. 5 is a graph illustrating a relationship between driving voltages and current densities in an OLED according to an aspect of the present invention and Comparative OLED.

FIG. 5 is a graph illustrating a relationship between driving voltages and current densities in an OLED according to an aspect of the present invention and a Comparative OLED. A horizontal axis represents the driving voltages (V), and a vertical axis represents the current densities (mA/cm$^2$).

Referring to FIG. 5, in the OLED according to an aspect of the present invention, when the driving voltages are 5V, 6V, and 7V, the current densities are about 50 mA/cm$^2$, 100 mA/cm$^2$, and 150 mA/cm$^2$, respectively. Also, in the Comparative OLED, when the driving voltages are 5V, 6V, and 7V, the current densities are about 50 mA/cm$^2$, 100 mA/cm$^2$, and 150 mA/cm$^2$, respectively. Accordingly, it can be noted that the OLED according to an aspect of the present invention shows similar current densities to those of the Comparative OLED when OLED according to an aspect of the present invention has the same driving voltages as the Comparative OLED, even when a cathode is replaced with a charge generation layer.

Figure 6:
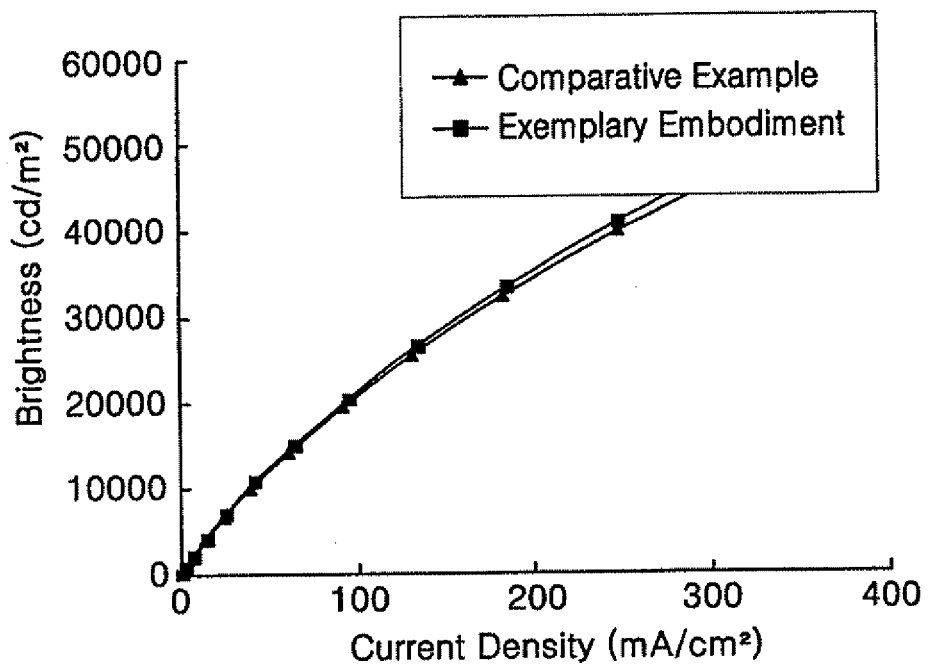
FIG. 6 is a graph illustrating a relationship between current densities and brightnesses in an OLED according to an aspect of the present invention and Comparative OLED.

FIG. 6 is a graph illustrating a relationship between current densities and brightnesses in an OLED according to an aspect of the present invention and a Comparative OLED. A horizontal axis represents the current densities (mA/cm$^2$), and a vertical axis represents the brightnesses (cd/m$^2$).

Referring to FIG. 6, in the OLED according to an aspect of the present invention, when the current densities are 100 mA/cm$^2$ and 200 mA/cm$^2$, the brightnesses are about 20000 cd/m$^2$ and 32000 cd/m$^2$, respectively. In the Comparative OLED, when the current densities are 100 mA/cm$^2$ and 200 mA/cm$^2$, the brightnesses are about 20000 cd/m$^2$ and 32000 cd/m$^2$, respectively. Accordingly, it can be noted that the OLED according to an aspect of the present invention shows similar brightnesses to those of the Comparative OLED when the OLED according to an aspect of the present invention has the same current densities as the Comparative OLED, even when a cathode is replaced with a charge generation layer.

Figure 7:
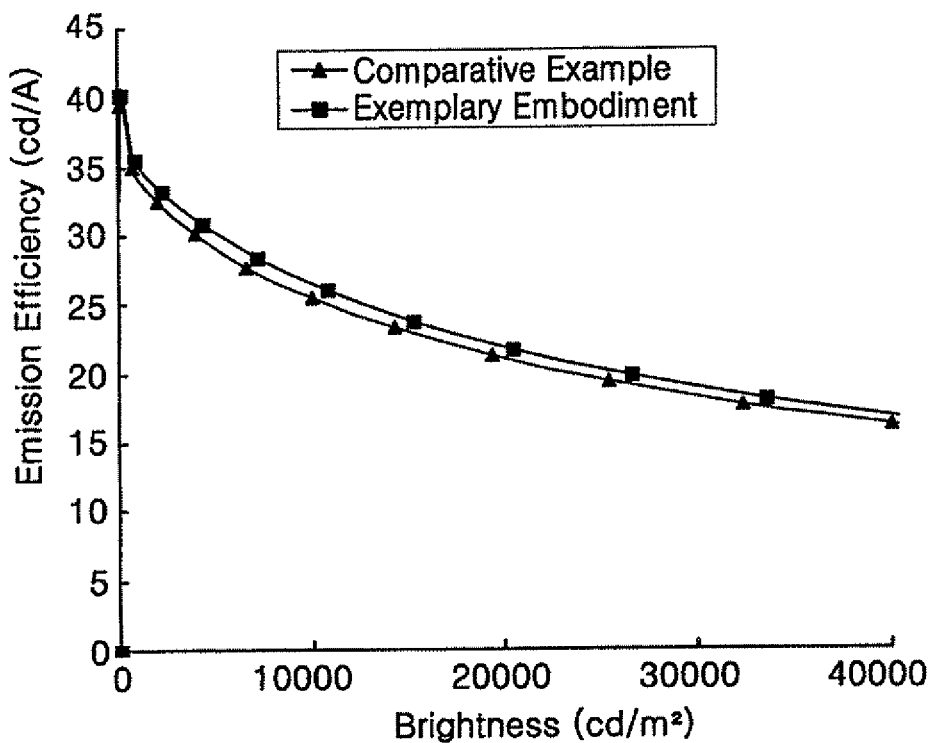
FIG. 7 is a graph illustrating a relationship between brightnesses and emission efficiencies in an OLED according to an aspect of the present invention and Comparative OLED.

FIG. 7 is a graph illustrating a relationship between brightnesses and emission efficiencies in an OLED according to an aspect of the present invention and a Comparative OLED. A horizontal axis represents the brightnesses (cd/m$^2$), and a vertical axis represents the emission efficiencies (cd/A).

Referring to FIG. 7, the OLED according to an aspect of the present invention, when the brightnesses are 0 cd/m$^2$, 10000 cd/m$^2$ and 20000 cd/m$^2$, the emission efficiencies are about 40 cd/A, 25 cd/A, and 21 cd/A, respectively. Also, in the Comparative OLED, when the brightnesses are 0 cd/m$^2$, 10000 cd/m$^2$ and 20000 cd/m$^2$, the emission efficiencies are about 40 cd/A, 25 cd/A, and 21 cd/A, respectively. Accordingly, it can be noted that the OLED according to an aspect of the present invention shows similar emission efficiencies to those of the Comparative OLED when the OLED according to an aspect of the present invention has the same brightnesses as the Comparative OLED, even when a cathode is replaced with a charge generation layer.

As described above, the OLED according to an aspect of the present invention does not need to have a separate cathode because of a charge generation layer that generates holes and electrons. Accordingly, defects occurring during formation of an anode decrease, and reliability of the OLED increases.

In other aspects of the present invention, a cathode may be formed in place of the anode, and the OLED may be an anode replaced with a charge generation layer.

In the figures, the dimensions of layers and regions may be exaggerated for clarity. It will also be understood that when a layer or element is referred to as being "on" or "over" another layer or substrate, it can be directly on the other layer or substrate, or intervening layers may also be present. Further, it will be understood that when a layer is referred to as being "under" or "below" another layer, it can be directly under, or one or more intervening layers may also be present.

Although a few embodiments the present invention have been shown and described, it would be appreciated by those skilled in the art that changes may be made in this embodiment without departing from the principles and spirit of the invention, the scope of which is defined in the claims, and their equivalents.

What is claimed is:

1. An organic light emitting display device (OLED), comprising:
   a substrate;
   a reflective layer disposed on the substrate;
   a charge generation layer disposed on the reflective layer to generate electrons and holes;
   an organic layer disposed on the charge generation layer and including an emission layer; and
   an anode disposed on the organic layer.

2. The OLED according to claim 1, wherein the reflective layer is formed of aluminum, silver, or an alloy thereof.

3. The OLED according to claim 1, wherein the charge generation layer comprises a plurality of layers.

4. The OLED according to claim 1, wherein the charge generation layer is formed to a thickness of 70 to 2000 Å.

5. The OLED according to claim 1, wherein the organic layer comprises at least one layer selected from a group consisting of a hole injection layer, a hole transport layer, a hole blocking layer, an electron transport layer, and an electron injection layer.

6. The OLED according to claim 3, wherein the plurality of layers comprise an inorganic compound layer, and a mixed layer of an electron transport layer material and a metal dopant.

7. The OLED according to claim 6, wherein the inorganic compound layer is formed to a thickness of 20 to 1000 Å.

8. The OLED according to claim 6, wherein the inorganic compound layer is formed of one selected from a group consisting of tungsten oxide (WO$_3$), vanadium oxide (V$_2$O$_5$), molybdenum oxide (MoO$_x$), beryllium oxide (Be$_2$O$_3$), rhenium oxide (Re$_2$O$_7$), ferric chloride (FeCl$_3$), ferric bromide (FeBr$_3$), ferric iodide (FeI$_3$), aluminum chloride (AlCl$_3$), aluminum bromide (AlBr$_3$), gallium chloride (GaCl$_3$), gallium bromide (GaBr$_3$), gallium iodide (GaI$_3$), indium chloride (InCl$_3$), indium bromide (InBr$_3$), indium iodide (InI$_3$), antimony pentachloride (SbCl$_5$), arsenic pentafluoride (AsF$_5$), arsenic trifluoride (AsF$_3$), and boron trifluoride (BF$_3$).

9. The OLED according to claim 6, wherein the mixed layer is formed to a thickness of 50 to 1000 Å.

10. The OLED according to claim 6, wherein the electron transport layer material comprises one selected from a group consisting of a quinoline derivative, a benzoquinoline derivative, an oxazole-based ligand, a thiazole-based ligand, an oxadiazole derivative, and a phenanthroline derivative.

11. The OLED according to claim 6, wherein the metal dopant comprises one selected from magnesium, cesium, and lithium.

12. An organic light emitting display device (OLED), comprising:
   a substrate;
   a semiconductor layer disposed on the substrate;
   a gate insulating layer disposed on an entire surface of the substrate including the semiconductor layer;
   a gate electrode disposed in a region corresponding to the semiconductor layer on the gate insulating layer;

an interlayer insulating layer disposed on the entire surface of the substrate including the gate electrode;

source and drain electrodes disposed on the interlayer insulating layer, and electrically connected to the semiconductor layer;

a passivation layer disposed on the entire surface of the substrate including the source and drain electrodes;

a planarization layer disposed on the passivation layer;

a reflective layer disposed on the planarization layer;

a charge generation layer disposed on the substrate including the reflective layer, and electrically connected to the source or drain electrode, and to generate electrons and holes;

an organic layer disposed on the charge generation layer, and including an emission layer; and an anode disposed on the organic layer.

13. The OLED according to claim 12, wherein the reflective layer is formed of aluminum, silver, or an alloy thereof.

14. The OLED according to claim 12, wherein the charge generation layer comprises a plurality of layers.

15. The OLED according to claim 12, wherein the charge generation layer is formed to a thickness of 70 to 2000 Å.

16. The OLED according to claim 12, wherein the organic layer comprises at least one layer selected from a group consisting of a hole injection layer, a hole transport layer, a hole blocking layer, an electron transport layer, and an electron injection layer.

17. The OLED according to claim 14, wherein the plurality of layers comprise an inorganic compound layer, and a mixed layer of an electron transport layer material and a metal dopant.

18. The OLED according to claim 17, wherein the inorganic compound layer is formed to a thickness of 20 to 1000 Å.

19. The OLED according to claim 17, wherein the inorganic compound layer is formed of one selected from a group consisting of tungsten oxide ($WO_3$), vanadium oxide ($V_2O_5$), molybdenum oxide ($MoO_x$), beryllium oxide ($Be_2O_3$), rhenium oxide ($Re_2O_7$), ferric chloride ($FeCl_3$), ferric bromide ($FeBr_3$), ferric iodide ($FeI_3$), aluminum chloride ($AlCl_3$), aluminum bromide ($AlBr_3$), gallium chloride ($GaCl_3$), gallium bromide ($GaBr_3$), gallium iodide ($GaI_3$), indium chloride ($InCl_3$), indium bromide ($InBr_3$), indium iodide ($InI_3$), antimony pentachloride ($SbCl_5$), arsenic pentafluoride ($AsF_5$), arsenic trifluoride ($AsF_3$), and boron trifluoride ($BF_3$).

20. The OLED according to claim 17, wherein the mixed layer is formed to a thickness of 50 to 1000 Å.

21. The OLED according to claim 17, wherein the electron transport layer material comprises one selected from a group consisting of a quinoline derivative, a benzoquinoline derivative, an oxazole-based ligand, a thiazole-based ligand, an oxadiazole derivative, and a phenanthroline derivative.

22. The OLED according to claim 17, wherein the metal dopant comprises one selected from magnesium, cesium, and lithium.

* * * * *